United States Patent
Walker

(10) Patent No.: US 10,886,875 B2
(45) Date of Patent: Jan. 5, 2021

(54) SOLAR POWERED COOLER FOR SMART DEVICE

(71) Applicant: Tapicu, Inc., Long Beach, CA (US)

(72) Inventor: Reginald L. Walker, Long Beach, CA (US)

(73) Assignee: Tapicu, Inc., Long Beach, CA (US)

( * ) Notice: Subject to any disclaimer, the term of this patent is extended or adjusted under 35 U.S.C. 154(b) by 4 days.

(21) Appl. No.: 15/911,154

(22) Filed: Mar. 4, 2018

(65) Prior Publication Data

US 2019/0341884 A1 Nov. 7, 2019

Related U.S. Application Data

(60) Provisional application No. 62/600,948, filed on Mar. 6, 2017.

(51) Int. Cl.
| | |
|---|---|
| *H02S 40/42* | (2014.01) |
| *G06F 1/16* | (2006.01) |
| *G06F 1/20* | (2006.01) |
| *H04B 1/3827* | (2015.01) |
| *H05K 7/20* | (2006.01) |

(52) U.S. Cl.
CPC .......... *H02S 40/425* (2014.12); *G06F 1/1632* (2013.01); *G06F 1/203* (2013.01); *H04B 1/3827* (2013.01); *H05K 7/20145* (2013.01)

(58) Field of Classification Search
CPC ........ H02S 40/425; G06F 1/1632; G06F 1/20; G06F 1/203; G06F 1/206; H04B 1/3827; H05K 7/20145; H05K 7/20136; Y02E 10/50
USPC .................. 361/679.48, 679.55, 679.56, 695
See application file for complete search history.

(56) References Cited

U.S. PATENT DOCUMENTS

| | | | |
|---|---|---|---|
| 8,051,904 B1 | 11/2011 | Whiting | |
| 2002/0097559 A1* | 7/2002 | Inoue | G06F 1/203 361/688 |
| 2007/0152633 A1 | 7/2007 | Lee | |
| 2011/0045866 A1 | 2/2011 | Harris | |

(Continued)

FOREIGN PATENT DOCUMENTS

CN 203135945 U * 8/2013

OTHER PUBLICATIONS

Dong Wei; Huo Dongchen; Yang Liang, "Multifunctional cellphone protective casing", Aug. 14, 2013, Entire Document (Translation of CN 203135945). (Year: 2013).*

(Continued)

*Primary Examiner* — Stephen S Sul
(74) *Attorney, Agent, or Firm* — Louis Wu

(57) ABSTRACT

A solar powered cooler for a smart device such as a smartphone or smart tablet is provided. The cooler may include an upper fan casing, an optional bottom fan casing, smart device holder, and an air passage formed between the upper fan casing and the smart device holder. Also provided are one or more cooling fans drawing air into the air passage along a substantially vertical direction. One or more solar panels allows the cooler to harvest solar energy and deliver electric power to the one or more fans, or motors thereof. The solar panels are connected by one or more, e.g., a pair of, connector cables to the motor. The cooler may cool an entire bottom surface of the smart device using one or more cooling fans.

9 Claims, 12 Drawing Sheets

(56) References Cited

U.S. PATENT DOCUMENTS

| | | | |
|---|---|---|---|
| 2011/0200219 A1* | 8/2011 | Vizcarra | G06F 1/1632 |
| | | | 381/332 |
| 2012/0218211 A1* | 8/2012 | McRae | H02J 7/025 |
| | | | 345/173 |
| 2013/0287595 A1 | 10/2013 | Horng | |
| 2014/0103789 A1* | 4/2014 | Cox, III | A45C 11/321 |
| | | | 312/280 |
| 2014/0131017 A1 | 5/2014 | Yang et al. | |
| 2015/0041104 A1* | 2/2015 | De Bock | F04D 33/00 |
| | | | 165/104.34 |
| 2015/0355693 A1* | 12/2015 | Chang | H05K 5/0086 |
| | | | 361/679.48 |
| 2016/0165751 A1* | 6/2016 | Varadarajan | H05K 7/20136 |
| | | | 165/80.2 |
| 2018/0359345 A1* | 12/2018 | Weng | H05K 7/20436 |

OTHER PUBLICATIONS

PCT Notification of Trasmittal of the International Search Report and the Written Opinion of the International Searching Authority of the Declaration.

* cited by examiner

SOLAR POWERED COOLER FOR SMART DEVICE

CROSS-REFERENCE TO RELATED APPLICATIONS

This application claims benefit of provisional application Ser. No. 62/600,948, filed on Mar. 6, 2017, by the Reginald L. Walker, the disclosure of which is incorporated by reference in its entirety.

BACKGROUND OF THE INVENTION

Field of the Invention

The present invention relates generally to fans and, more specifically, to a solar powered cooling unit which provides a housing that can be comfortably hand held. The unit typically has a small, compact, rectangular design that includes a fan and may be easily stored and transported on one's person, in a brief case or beach bag.

Description of the Prior Art

There is a need for solar cooling units. For example, a number of solar powered fan devices have been designed for personal cooling or ventilation. Typical of these is U.S. Pat. No. 4,899,645 issued to Wolfe, et al. on Feb. 13, 1990.

Another patent was issued to Hwang on Nov. 27, 1990 as U.S. Pat. No. 4,974,126. Yet another U.S. Pat. No. 4,986,169 was issued to Chen on Jan. 22, 1991, and still yet another was issued on Sep. 3, 1991 to Wu, et al. as U.S. Pat. No. 5,044,258.

Another patent was issued to Juang on Sep. 22, 1992 as U.S. Pat. No. 5,148,736. Yet another U.S. Pat. No. 5,250,265 was issued to Kawaguchi, et al. on Oct. 5, 1993. Another was issued to Ferng on Dec. 31, 1996 as U.S. Pat. No. 5,588,909, and still yet another was issued on Mar. 7, 2000 to Asenguah, et al. as U.S. Pat. No. 6,032,291.

Another patent was issued to Sibbe on May 30, 1984 as German Patent No. DE3337241. Yet another U.K. Patent No. GB2241378 was issued to Forsyth on Aug. 28, 1991. Another was issued to Takahashi on Oct. 3, 1995 as Japan Patent No. JP7253096, and still yet another was issued on Jul. 18, 2003 to Sha as Japan Patent No. JP2003201990. Another patent was issued to Patel on Jan. 11, 2011 as U.S. Pat. No. 7,866,958.

There is also a need for holders for smart devices. Typical of these is U.S. Pat. No. 8,861,714 issued to Leibenhaut et al on Oct. 14, 2014. Another patent was issued to Crome et al. on Apr. 23, 2013 as U.S. Pat. No. 8,428,665. Another patent was issued to Leibenhaut, et al on Oct. 20, 2015 as U.S. Pat. No. 9,167,062. Yet another patent application was submitted by Chu on Sep. 15, 2014 as U.S. Pat. App. Publ. No. 2016/0076547.

Another patent was issued to An et al on Dec. 13, 2016 as U.S. Pat. No. 9,521,224, and still yet another was issued on Apr. 29, 2014 to Trinh et al as U.S. Pat. No. 8,711,553.

Yet another patent application was submitted by Ross III on Sep. 17, 2009 as U.S. Pat. App. Publ. No. 2009/0233656. Yet another patent application submitted by Backman et al on Oct. 18, 2015 as U.S. Pat. App. Publ. No. 2015/0283950.

There is a further need solar power car ventilators. Typical of these is U.S. Pat. No. 5,148,736 issued to Juang on Sep. 22, 1992 and still yet another was issued on Oct. 8, 2011 to Tarnowsky et al as U.S. Pat. No. 8,039,988.

However, none of the above-identified publications specifically addresses drawbacks associated with the heat generated by battery powered smart devices. Similarly, none of the above-identified publication addresses drawbacks associated with the operation of smart devices in excessively hot environments.

Thus, opportunities exist to provide an easily carriable fan for smart devices such as smart phone and smart tablets with one or more solar panels, which can be used outdoors with no power supply.

SUMMARY OF THE INVENTION

A first object of the present invention is to provide one or more solar powered fans for smart devices.

Another object of the present invention is to provide compact rectangular housing that can be comfortably hand held powered by means of one or more solar panels. The intensity of solar energy may work to control power to one or more fan motors.

A further object of the present invention is to provide a small, portable solar panel to power the one or more fans.

In a first embodiment, then, a solar powered cooler is provided for a smart device such as a smartphone or smart tablet. The cooler includes an upper fan casing, an optional bottom fan casing, smart device holder, and an air passage formed between the upper fan casing and the smart device holder. Also provided are one or more cooling fans drawing air into the air passage along a substantially vertical direction. One or more solar panels allows the cooler to harvest solar energy and deliver electric power to the one or more fans, or motors thereof. The solar panels are connected by one or more, e.g., a pair of, connector cables to the motor.

Optionally, a solar panel protector cover may be provided over the solar panel. The cover may include a clear plastic window and may be secured to the solar panel with snap fastener and insert elements.

Typically, the one or more cooling fans are located between the upper and lower fan casings, and each fan rotate about a substantially vertical axis to draw air into the air passage along the substantially vertical direction. In addition (or in the alternative), one or more cooling fans may rotate about a horizontal axis.

Thus, one or more vent holes may be formed in the upper and/or lower fan casing. Air drawn in by the one or more cooling fans may be forced through the air passage and discharged through the one or more vent holes in order to cool the bottom surface of a smart device in the smart device holder.

The smart device holder is typically constructed to containing a smart device such as a smartphone or smart tablet. The holder may have a construction that allows horizontal air flow over a bottom surface of the smart device. Optionally, the holder allows the smart device to be securely attached to the upper fan casing, e.g., by magnetic means.

In another embodiment, a solar powered cooler similar to the embodiment described above is provided, wherein the upper fan casing including one or more vent holes. The bottom fan casing may include one or more air inlet holes. The upper and lower fan casings define an air passage to allow air to flow from the air inlet holes to the one or more vent holes. The one or more air inlet holes may be located at an edge or near an edge of the bottom fan casing. Air drawn in by the one or more cooling fans may be forced out through the air passage in a horizontal direction and discharged through the one or more vent holes in order to cool the smart device.

In a further embodiment, a solar powered cooler similar to the embodiment described above is provided, wherein the one or more air inlet holes are located at an edge or near an edge of the bottom fan casing. One or more cooling fans are located on the bottom fan casing covering the one or more air inlet holes, wherein the one or more cooling fans are located between the upper fan casing and the bottom fan casing.

DETAILED DESCRIPTION OF THE INVENTION

Figure 1:
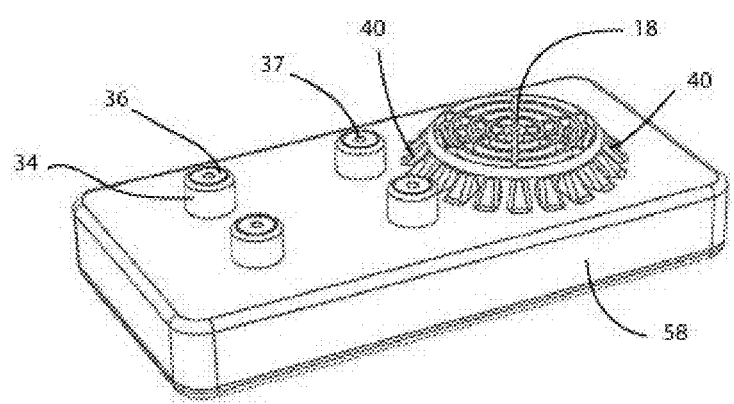
FIG. 1 is a perspective view of a single fan solar powered cooler for a smart device such as a smartphone or smart tablet.

Before describing the present invention in detail, it is to be understood that the invention is not limited to specific separation devices or types of analytical instrumentation, as such may vary. It is also to be understood that the terminology used herein is for the purpose of describing particular embodiments only, and is not intended to be limiting.

In addition, as used in this specification and the appended claims, the singular article forms "a," "an," and "the" include both singular and plural referents unless the context clearly dictates otherwise. Thus, for example, reference to "a fan" includes a plurality of fans as well as a single fan, reference to a "solar panel" includes a single solar panel as well as a combination of solar panels, and the like.

Furthermore, terminology indicative or suggestive of a particular spatial relationship between elements of the invention is to be construed in a relative sense rather an absolute sense unless the context of usage clearly dictates to the contrary. For example, the terms "over" and "on" as used to describe the spatial orientation of a first item relative to a second item does not necessarily indicate that the first item is located above the second item. Thus, in a cooler that includes a holder placed on or over a smart device, the holder may be located above, at the same level as, or below the smart device depending on the cooler's orientation. Similarly, an "upper" surface of a smart device may lie above, at the same level as, or below other portions of the device depending on the orientation of the device.

In this specification and in the claims that follow, reference will be made to a number of terms that shall be defined to have the following meanings, unless the context in which they are employed clearly indicates otherwise:

The terms "electronic," "electronically," and the like are used in their ordinary sense and relate to structures, e.g., semiconductor microstructures, that provide controlled conduction of electrons, holes and/or other charge carriers.

"Optional" or "optionally" means that the subsequently described circumstance may or may not occur, so that the description includes instances where the circumstance occurs and instances where it does not.

The term "smart device" is used herein in its ordinary sense and refers to an electronic device, generally connected to other devices or networks via different wireless protocols such as Bluetooth, NFC, Wi-Fi, 3G, etc., that can operate to some extent interactively and autonomously. Exemplary smart devices include The term "solar panel" is used herein in its ordinary sense and refers to a panel designed to absorb sunlight and/or other photonic radiation as a source of energy for generating electricity.

In general, the invention provides an easily carriable or portable cooler that includes a fan powered by with one or more solar panels. The fan directs air toward a holder for a smart device such as a smart phone or a smart tablet, thereby cooling the smart device. The cooler can be used outdoors with no power supply, and overcomes the shortcomings of the prior art. That is, a solar powered smart device fan is provided with a much broader spectrum of both portable and fixed operating applications, whereas prior art is application specific.

Turning now descriptively to the drawings, in which like reference numbers denote like elements throughout the several views, various embodiments of the invention are depicted. With regard to the reference numerals used, the following numbering is used throughout the various drawing figures for single fan embodiments of the invention.

Figure 2:
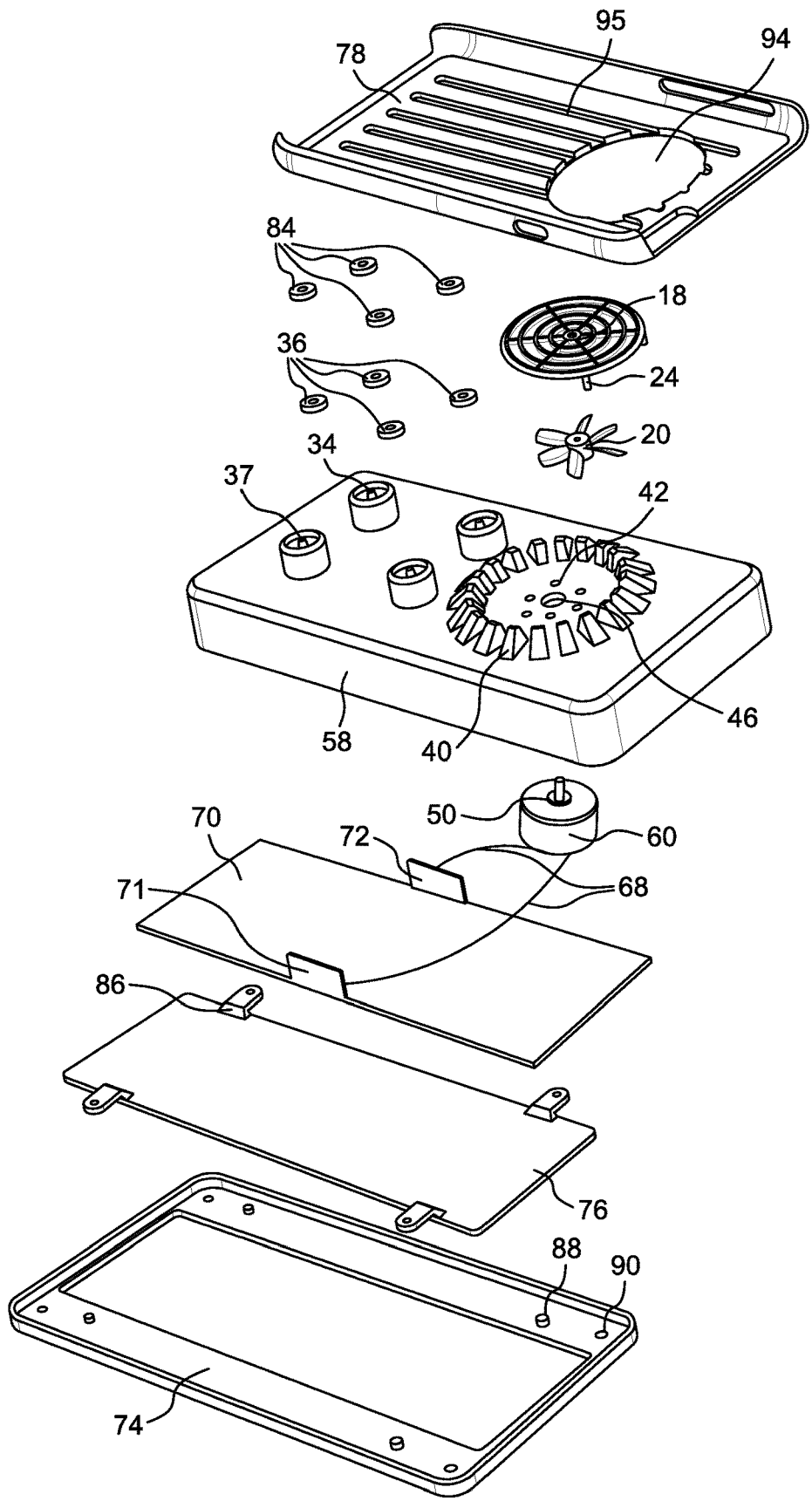
FIG. 2 is an exploded perspective view of the single fan solar powered cooler of FIG. 1 with the corresponding smart device holder.
Figure 7:
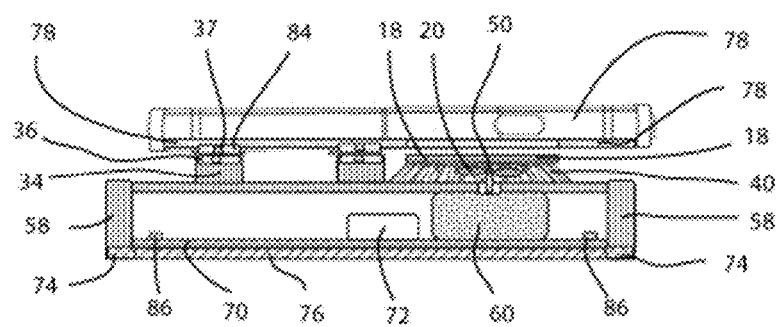
FIG. 7 is a side sectional view of the single fan solar powered cooler of FIG. 3 with the corresponding smart device holder along cut lines VII-VII.
Figure 8:
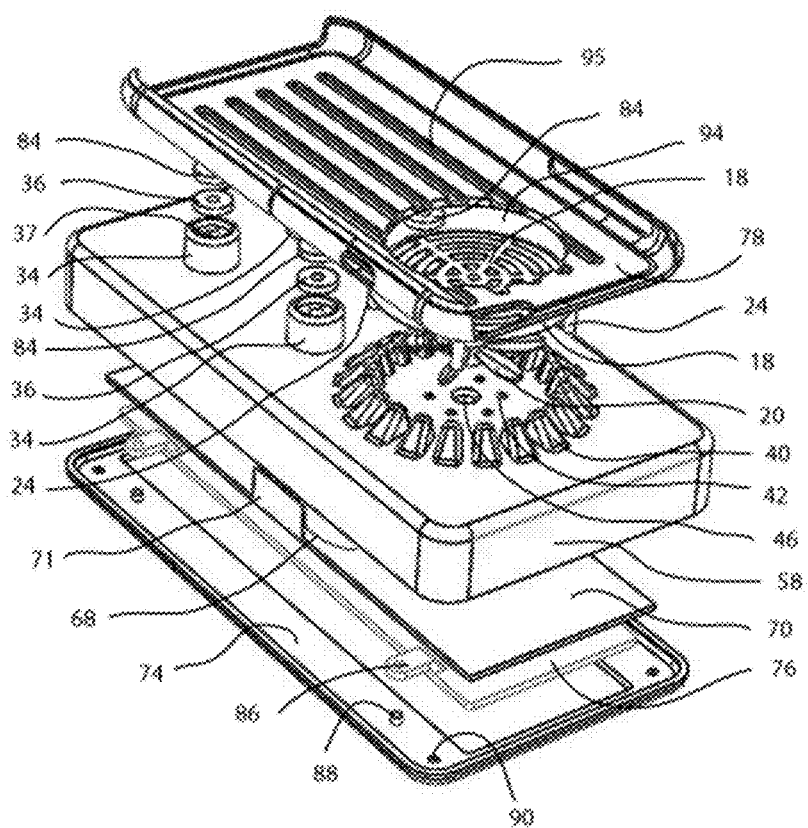
FIG. 8 is a condensed exploded perspective view of the single fan solar powered cooler of FIG. 2.

18 protective grille for 20 fan blade
20 fan blade
24 protective grille insertion pegs
36 magnet holders for the upper fan casing
37 magnet holder placement peg
40 smart device air flow passage
42 circular vent holes for 60 front fan motor
46 receiving hole for 50 front fan motor spindle
50 fan motor spindle
58 upper fan casing for 60 front fan motor
60 front fan motor
68 electric connector wiring
70 solar panel
71 positive terminal point
72 negative terminal point
74 bottom fan casing
76 transparent cover for 70 solar panel 78 smart device holder
84 magnets for 78 smart device holder
86 upper snap fastener
88 lower snap fastener insert
90 bottom fan casing air inlet in 74 bottom fan casing
94 air passage opening in 78 smart device holder for air flow
95 air flow grooves in 78 smart device holder A single fan solar powered cooler for a smart device such as a smartphone or smart tablet is shown in FIGS. 1 through 8. FIG. 1 provides a perspective view of certain assembled components of the single fan solar powered cooler for a smart device. FIG. 2 and FIG. 8 are exploded perspective views of a single fan solar powered cooler for a smart device. The device is magnetically connected to smart device holder 78. The holder 78 incorporates air passage opening 94 corresponding in position and size to the location of the protective grille 18 for fan blade 20 coupled to a fan motor spindle 50 for the front fan motor 60. The protective grille 18 is attached to the upper fan casing 58 using protective grille insertion pegs 24. Air flow is distributed over the bottom surface of a smart device by air flow grooves 95 which are long narrow shapes coupled with the circular air passage opening 94 incorporated in the upper surface of smart device holder 78.

Figure 5:
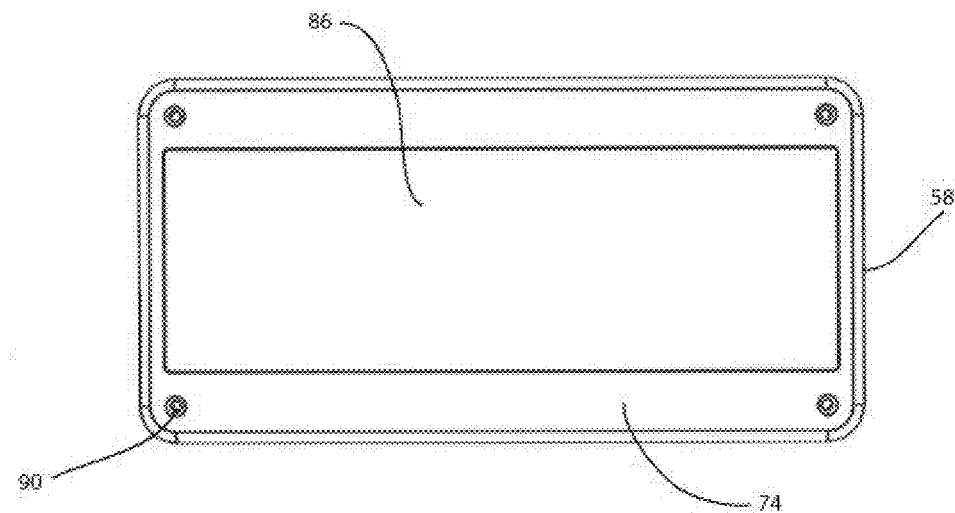
FIG. 5 is a bottom view of the single fan solar powered cooler.
Figure 6:
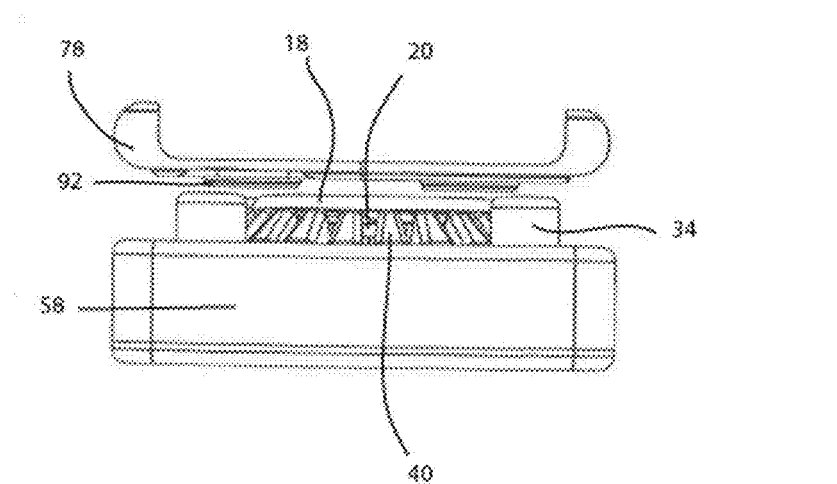
FIG. 6 is the rear view of the single fan solar powered cooler of s of FIG. 1 with the corresponding smart device holder.

Thus, FIG. 1, FIG. 2, and FIG. 8 show the single fan solar powered cooler which includes an upper fan casing 58 for front fan motor 60, housing a protective grille 18 for fan blade 20, magnet holders for upper fan casing 34, magnets for the for connecting the smart device holder 78 held in place by magnet holder placement pegs 37, circular vent holes 42 for front fan motor 60, receiving hole 46 for fan motor spindle 50, electric connector wiring 68, solar panel 70, positive terminal point 71, negative terminal point 72. FIG. 5 shows the bottom fan casing 74 providing support for the transparent cover 76 for solar panel 70 and incorporates upper snap fastener 86, lower snap fastener insert 88, and bottom fan casing air inlets 90 in bottom fan casing 78.

Returning to FIG. 2, circular vent holes 42 for front fan motor 60 are formed in the upper fan casing 58. Smart device air flow passage 40 and circular vent holes 42 for front fan motor 60 corresponding in position and size to the location of the protective grille 18 for fan blade 20 coupled to the fan motor spindle 50 for the front fan motor 60.

Figure 3:
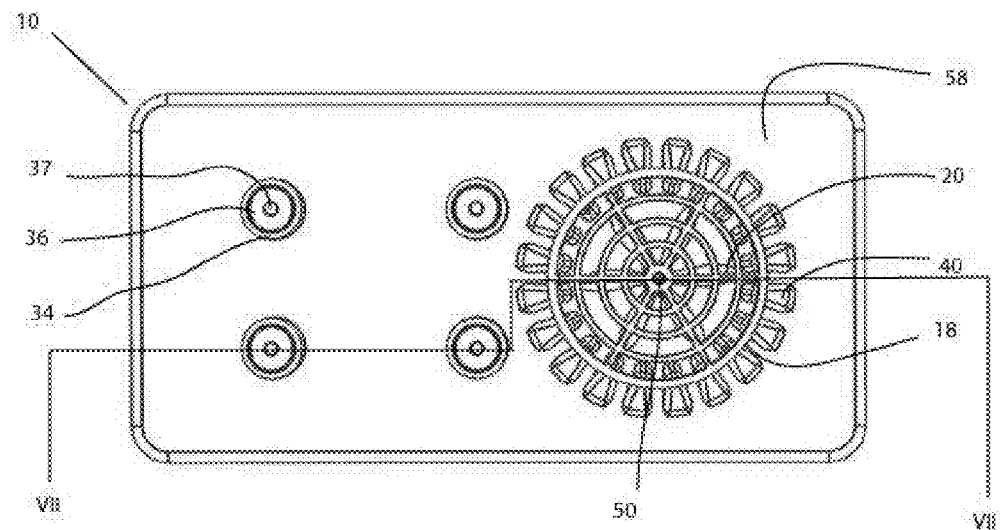
FIG. 3 is a top view of a single fan solar powered cooler.
Figure 4:
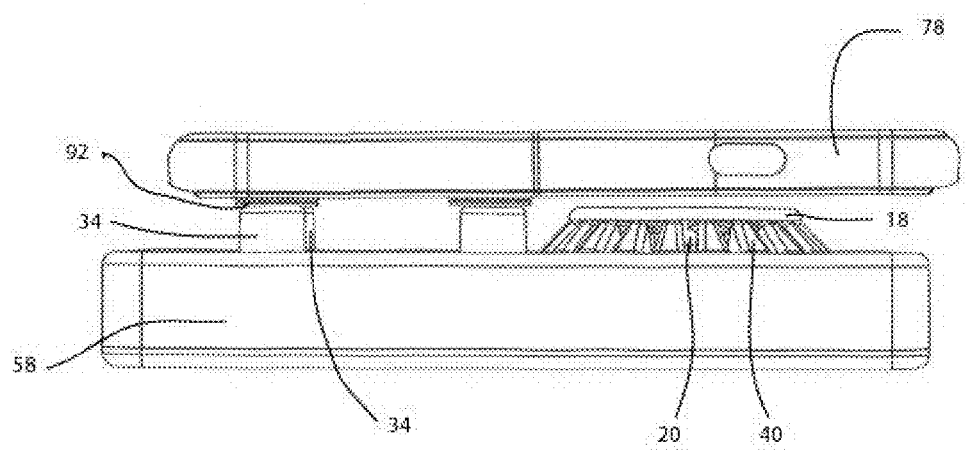
FIG. 4 is a side view of the single fan solar powered cooler of FIG. 1 with the corresponding smart device holder.

FIG. 7 is a side sectional view along cut line VII-VII of FIG. 3. FIG. 7 illustrates the smart device wherein a single fan solar powered cooler is magnetically connected to smart device holder 78. The air flow within and parallel to smart device such as a smartphone or smart tablet wherein the single fan solar powered cooler is magnetically connected to smart device holder 78 is blown vertically by the fan blade 20 coupled to the fan motor spindle 50 for the front fan motor 60. The smart device such as a smartphone or smart tablet is cooled by the air flow produced by the fan blade 20 coupled to the fan motor spindle 50 for the front fan motor 60.

The single fan solar powered cooler for a smart device addresses specific portions of the bottom surface of the smart device which are to be cooled. That is, the air blown up by the fan blade 20 coupled to the fan motor spindle 50 for the front fan motor 60, which are axial fans, into the smart device holder 78 is directly discharged horizontally through air flow grooves 95 which are long narrow shapes coupled with the circular air passage opening 94. Accordingly, the entire area of the bottom surface of the smart device such as a smartphone or smart tablet is cooled.

Referring to FIG. 2, FIG. 3, FIG. 4, FIG. 6, FIG. 7 and FIG. 8, air exiting smart device air flow passage 40 and circular vent holes 42 is moved along the bottom surface of the smart device contained within the smart device holder 78, thereby cooling the bottom surface of the smart device. Heat dissipation is carried out at portions of the bottom surface of the smart device with which the air collides. As a result, desired cooling is achieved.

That is, as shown in FIG. 2, the smart device may be magnetically connected to smart device holder 78 which incorporates air passage opening 94 corresponding in position and size to the location of the protective grille 18 for fan blade 20 coupled to the fan motor spindle 50 for the front fan motor 60 facilitates the continuous vertical alignment of air passage opening 94 with the corresponding protective grille 18 for fan blade 20 coupled to the fan motor spindle 50 for the front fan motor 60. The air passage opening 94 acts as a conduit for guiding air drawn by the fan blade 20 coupled to the fan motor spindle 50 for the front fan motor. The front fan motor 60 are not limited to their positions and number as long as they can blow air into the air passage opening 94. Additionally, a reduction in the height of the front fan motor 60 and the fan motor spindle 50 can reduce the total height of the single fan solar powered cooler for a smart device.

The single fan solar powered cooler for a smart device constructed as described above can cool the entire bottom surface area of the smart device such as a smartphone or smart tablet by magnetically connecting to smart device holder 78 to the upper fan casing 58. All of the individual components may be glued to their corresponding connecting parts to remain in place, respectively. Additionally, cooling can be achieved as shown in other embodiments such as the dual fan solar powered cooler for a smart device such as a smartphone or smart tablet.

In sum, in one embodiment of the present invention, air suction openings for single fan solar powered cooler for smart device include air flow passage 40, circular vent holes 42 is formed on the top surface of a housing upper fan casing 58 for front fan motor 60, and bottom fan casing air inlet 90 in bottom fan casing 74. An exhaust opening is formed on the top surface of a housing upper fan casing 58 through protective grille 18 for front fan blade 20 coupled to front fan motor 60 circulating air flow through a smart device holder 78 with an air passage opening 94 and air flow grooves 95 in smart device holder 78 for cooling the bottom surface of the smart device. The solar panel 70 for front fan motor 60 is connected to positive terminal point 71 and negative terminal point 72 using electric connector wiring 68 so that the fan motor may be driven by means of its power generation output. Thus, this portable type solar powered fan can be used simply without any place restrictions.

Figure 9:
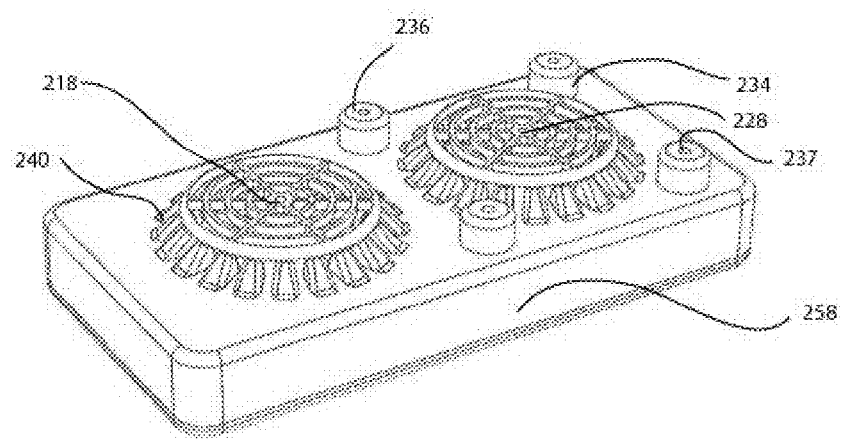
FIG. 9 is a perspective view of a dual fan solar powered cooler for a smart device such as a smartphone or smart tablet.
Figure 10:
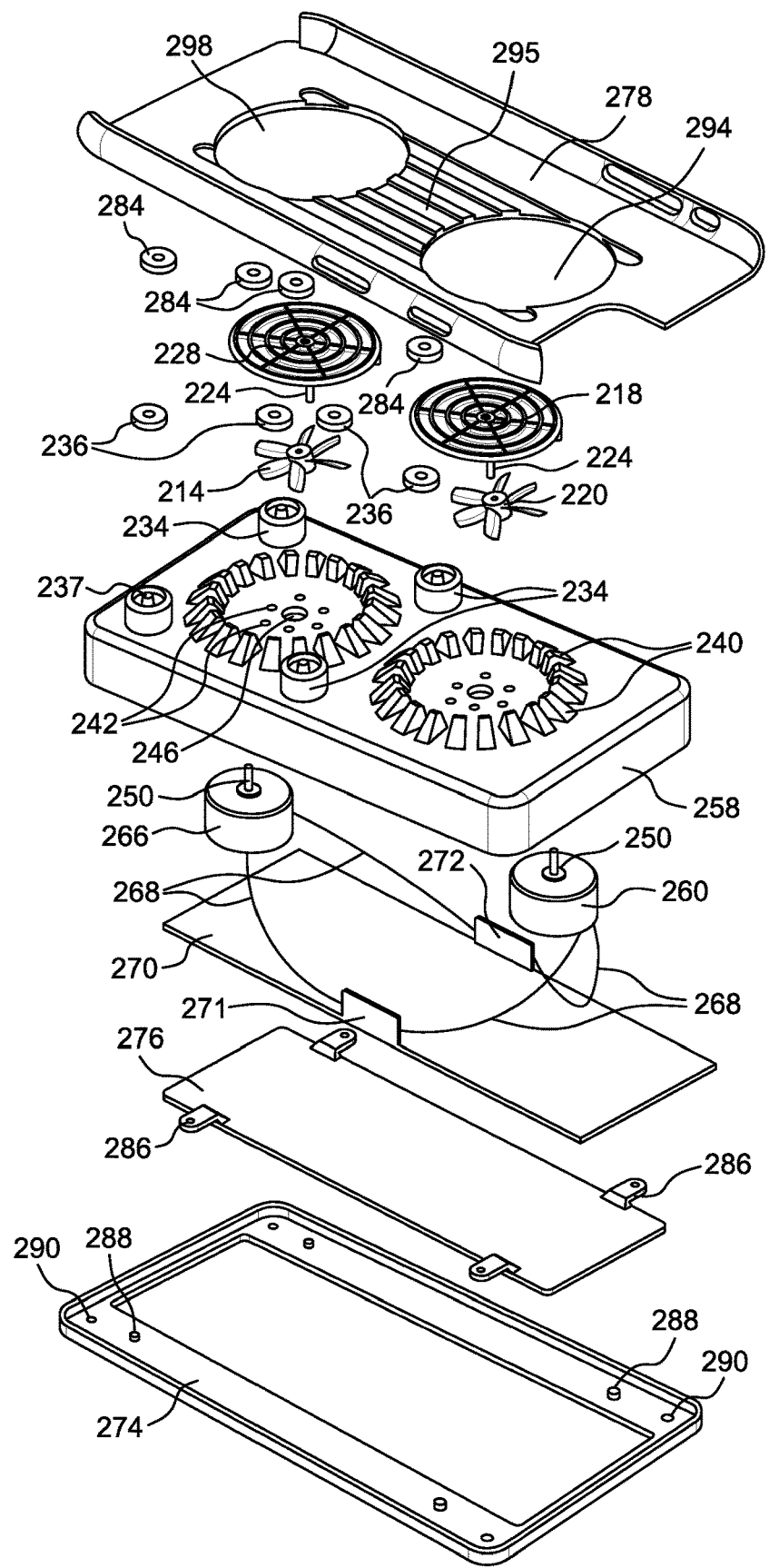
FIG. 10 is an exploded perspective view of the dual fan solar powered cooler of FIG. 9 with the corresponding smart device holder.
Figure 15:
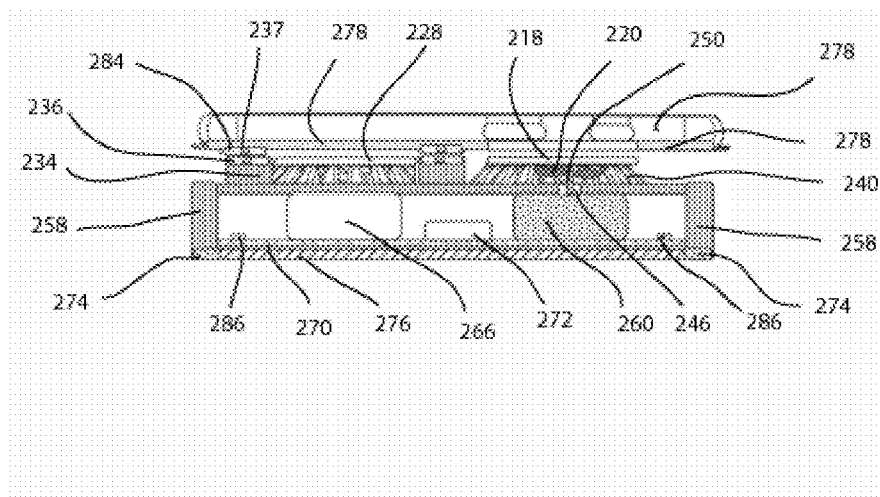
FIG. 15 is a side sectional view of the dual fan solar powered cooler of FIG. 11 with the corresponding smart device holder along cut lines XIII-XIII
Figure 16:
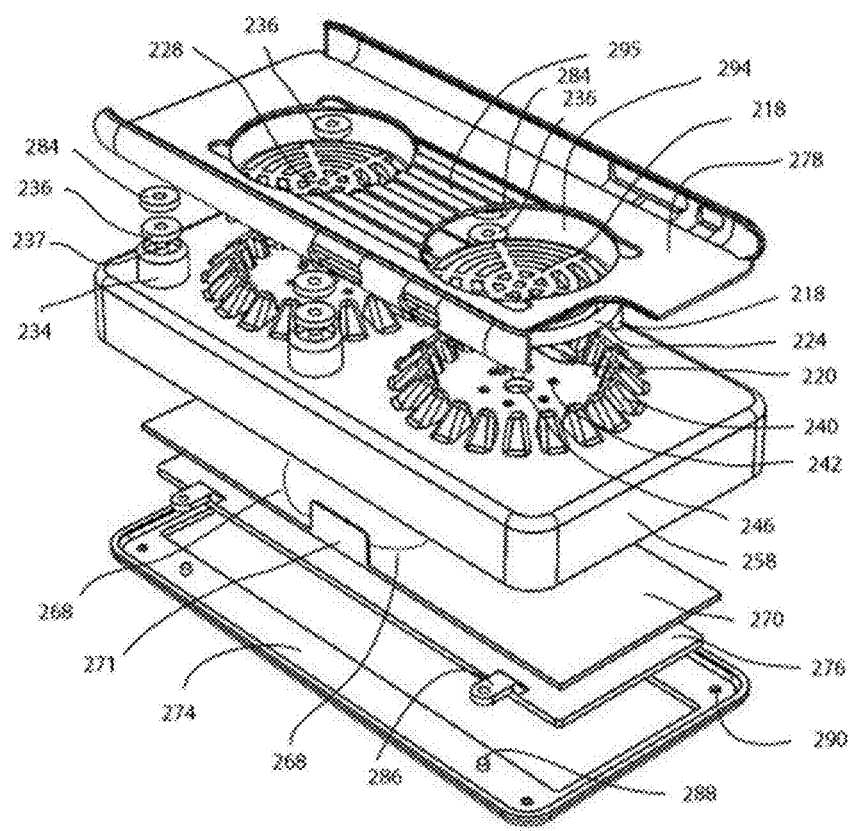
FIG. 16 is a condensed exploded perspective view of the dual fan solar powered cooler of FIG. 10.

The following numbering is used throughout the various drawing figures for dual fan embodiments of the invention.
218 front protective grille for 220 front fan blade
228 rear protective grille for 214 rear fan blade
220 front fan blade
214 rear fan blade
224 protective grille insertion pegs
234 magnet holders for upper fan casing
236 magnets for the upper fan casing
237 magnet holder placement peg
240 smart device air flow passage
242 circular vent holes for 260 front fan motor and 266 rear fan motor
246 receiving hole for 250 fan motor spindle
250 fan motor spindle 258 upper fan casing for 260 front fan motor and 266 rear fan motor
260 front fan motor
266 rear fan motor
268 electric connector wiring
270 solar panel
271 positive terminal point
272 negative terminal point
274 bottom fan casing
276 transparent cover for 270 solar panel
278 smart device holder
284 magnets for 278 smart device holder
286 upper snap fastener
288 lower snap fastener insert
290 bottom fan casing air inlet in 274 bottom fan casing
294 air passage opening in 278 smart device holder for air flow
295 air flow grooves in 278 smart device holder
298 air passage opening in 278 smart device holder for air flow In another embodiment, the invention provides a dual fan solar powered cooler for a smart device, e.g., as shown in FIGS. 9 through 16. FIG. 9 provides a perspective view of certain assembled components of the due fan solar powered cooler for a smart device. FIG. 10 and FIG. 16 are exploded perspective views of a dual fan solar powered cooler for a smart device. The device is magnetically connected to smart device holder 278. The holder 278 incorporates air passage opening 294 corresponding in position and size to the location of the front protective grille 218 for front fan blade 220. The holder 278 incorporates air passage opening 298 corresponding in position and size to the location of and rear protective grille 228 for rear fan blade 214. Blade 220 are coupled to the fan motor spindle 250 for the front fan motor 260. The front protective grille 218 and rear protective grille 228 are attached to the upper fan casing 258 using protective grille insertion pegs 224. Air flow is distributed over the bottom surface of smart device by air flow grooves 295 which are long narrow shapes coupled with the circular air passage opening 294 incorporated in the upper surface of smart device holder 278.

FIG. 10 and FIG. 16 show a dual fan solar powered cooler which includes an upper fan casing 258 for a pair of motors, i.e., front fan motor 260 and rear fan motor 266. Also shown housed by the casing 258 is a front protective grille 218 for front fan blade 220 and a rear protective grille 228 for rear fan blade 214, respectively. Additionally, provided are magnet holders for upper fan casing 234 and magnets for connecting the smart device holder 236, which are held in place by magnet holder placement pegs 237. Further provided are circular vent holes 242 for front fan motor 260 and rear fan motor 266, receiving hole 246 for fan motor spindle 250, electric connector wiring 268, solar panel 270, positive terminal point 271, and negative terminal point 272.

Figure 13:
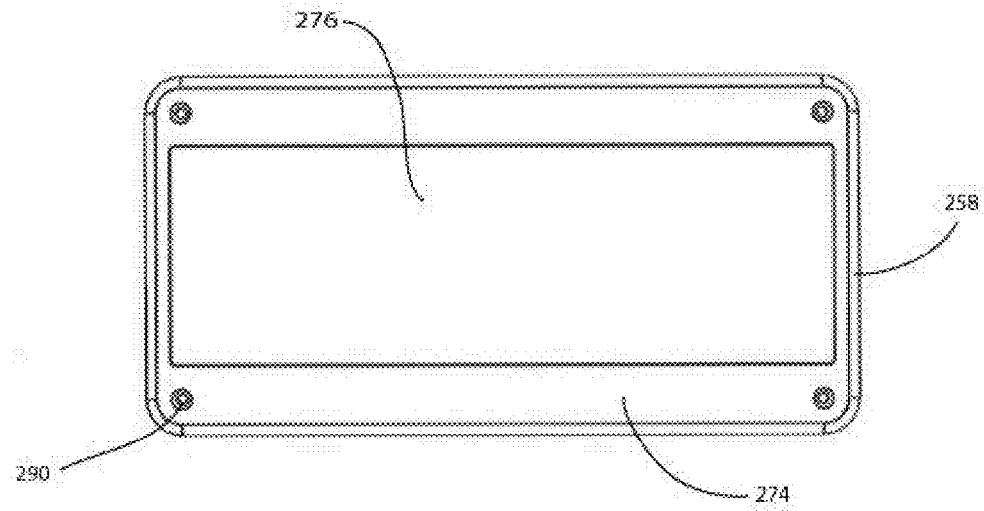
FIG. 13 is a bottom view of the dual fan solar powered cooler of FIG. 9 with the corresponding smart device holder.
Figure 14:
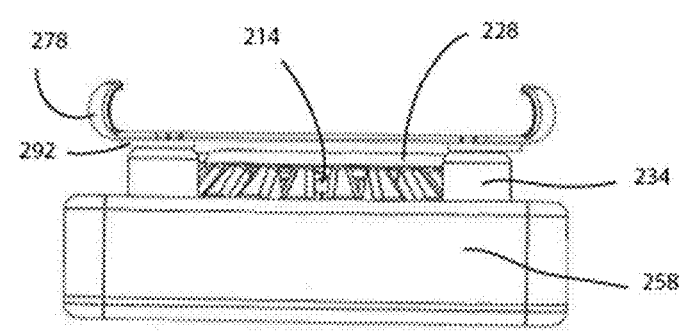
FIG. 14 is the rear view of the dual fan solar powered cooler of dual fan solar powered cooler of FIG. 9.

FIG. 13 shows the bottom fan casing 274 that provides support for the transparent cover 276 for solar panel 270. As shown in FIG. 10, the bottom fan casing 274 also incorporates upper snap fastener 286, lower snap fastener insert 288, and bottom fan casing air inlets 290. Circular vent holes 242 are formed in the upper fan casing 258 for front fan motor 260 and rear fan motor 266. Smart device air flow passage 240 and circular vent holes 242 for front fan motor 260 and rear fan motor 266 correspond in position and size to the location of the front protective grille 218 for front fan blade 220 and rear protective grille 228 for rear fan blade 214, which are coupled to the fan motor spindle 250 for front fan motor 260 and rear fan motor 266, respectively.

Figure 11:
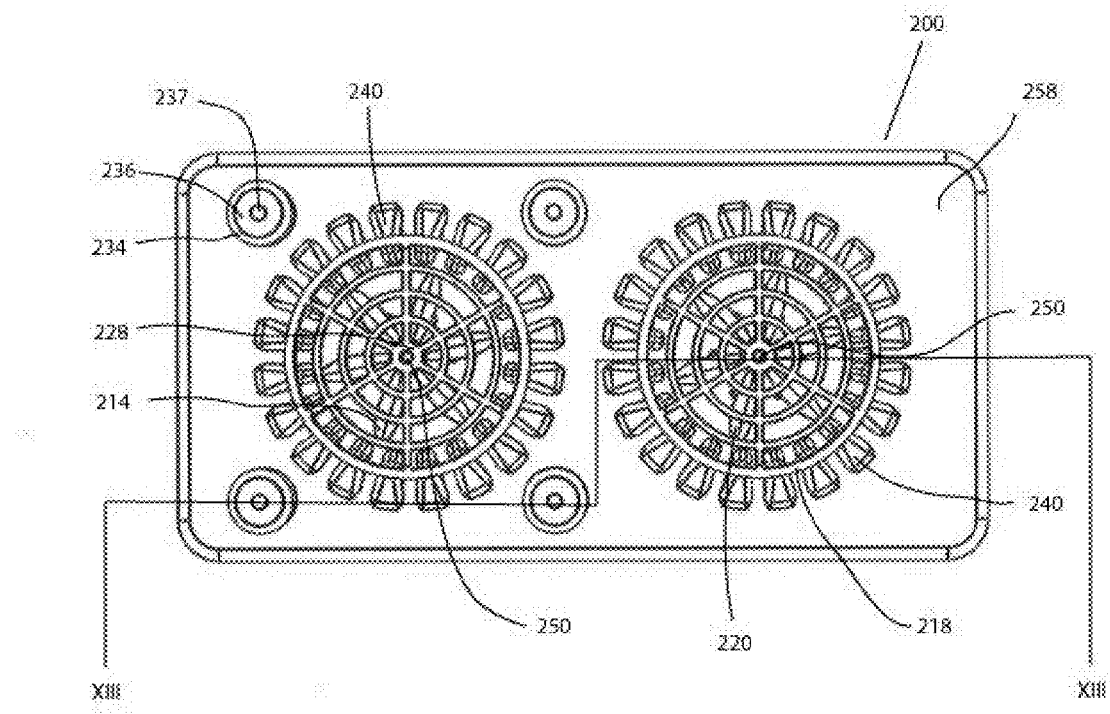
FIG. 11 is a top view of a dual fan solar powered cooler.
Figure 12:
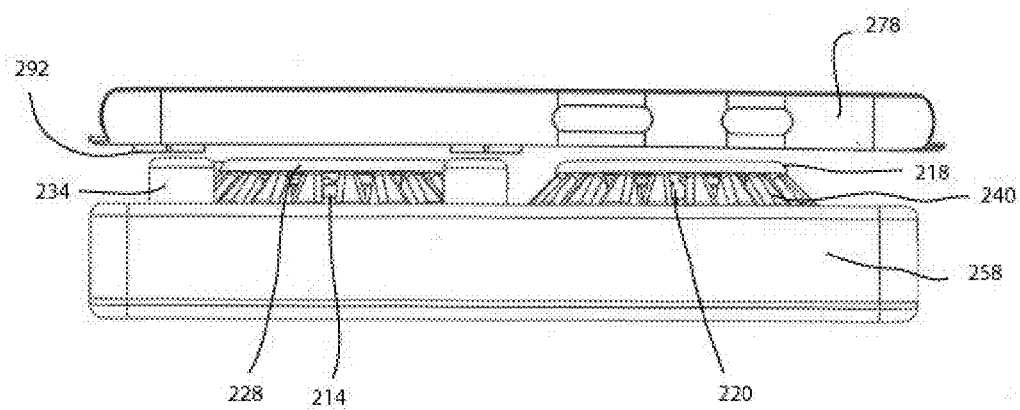
FIG. 12 is a side view of the dual fan solar powered cooler of FIG. 9 with the corresponding smart device holder.

FIG. 15 is a side sectional view along cut line XIII-XIII of FIG. 11 illustrates the smart device wherein the dual fan solar powered cooler is magnetically connected to smart device holder 278. Air flow within and parallel to smart device wherein the dual fan solar powered cooler is magnetically connected to smart device holder 278 is forced perpendicular to the front fan blade 220 and rear fan blade 214 coupled to their fan motor spindle 250 for front fan motor 260 and rear fan motor 266, respectively. The smart device is thereby cooled by the air flow produced by the front fan blade 220 and rear fan blade 214 coupled to their fan motor spindle 250 for front fan motor 260 and rear fan motor 266, respectively.

As shown FIG. 10 and FIG. 16, the dual fan solar powered cooler for a smart device addresses specific portions of the bottom surface of the smart device which are to be cooled. That is, the air is blown upward by the front fan blade 220 and rear fan blade 214, which are coupled to their fan motor spindle 250 for the front fan motor 260 and rear fan motor 266, respectively. Air from these axial fans is introduced into the smart device holder 278 and directly discharged upward flowing air through air flow grooves 295 which are long narrow shapes coupled with the circular air passage opening 294. Accordingly, the entire area of the bottom surface of the smart device such as a smartphone or smart tablet is cooled.

Referring to FIG. 11, FIG. 12, FIG. 14, and FIG. 15, the air exiting smart device air flow passage 240 and circular vent holes 242 is moved along the bottom surface of the smart device such as a smartphone or smart tablet contained within the smart device holder 278, thereby cooling the bottom surface of the smart device such as a smartphone or smart tablet. Portions of the bottom surface of the smart device with which the air collides are cooled via heat dissipation. That is, magnetically connected to smart device holder 278 which incorporates air passage opening 294 corresponding in position and size to the location of the front protective grille 218 for front fan blade 220 and rear protective grille 228 for rear fan blade 214. Fan motor spindle 250 for the front fan motor 260 facilitates the continuous vertical alignment of air passage opening 294 with the corresponding front protective grille 218 and rear protective grille 228 coupled to their fan motor spindle 250, respectively. The air passage opening 294 acts as a conduit for guiding air drawn by the front fan blade 220 and rear fan blade 214 coupled to their fan motor spindle 250 for the front fan motor, respectively. The front fan motor 260 and rear fan motor 266, are not limited to their positions and number as long as they can blow air into the air passage opening 294. Additionally, a reduction in the height of the front fan motor 260 and rear fan motor 266, and their respective fan motor spindle 250 can reduce the total height of the dual fan solar powered cooler for a smart device.

The dual fan solar powered cooler for a smart device constructed as described above can cool the entire bottom surface area of the smart device such as a smartphone or smart tablet by magnetically connected to smart device holder 278 to the upper fan casing 258. All of the individual components are glued to their corresponding connecting parts to remain in place, respectively.

In sum, air suction openings for dual fan solar powered cooler for smart device are shown as smart device air flow passage 240. Circular vent holes 242 are formed on top surface of a housing upper fan casing 258 for front fan motor 260 and rear fan motor 266. Bottom fan casing air inlet 290 is located in bottom fan casing 274. An exhaust opening is formed on the top surface of a housing upper fan casing 258 through front protective grille 218 for front fan blade 220 and through rear protective grille 228 for rear fan blade 214, each circulating air flow through a smart device holder 278 with dual air passage openings 294 and 298 with air flow grooves 295 in smart device holder 278 for cooling the bottom surface of the smart device. The solar panel 270 for front fan motor 260 and rear fan motor 266 is connected to positive terminal point 271 and negative terminal point 272 using electric connector wiring 268 so that the fan motors may be driven by means of its power generation output. Thus, this portable type solar powered fan can be used simply without any place restrictions.

As described above, the invention allows air to uniformly collide with a bottom surface of a smart device such as a smartphone or smart tablet. As a result, the invention provides more effectively cooling of the smart device when compared conventional implementations of fans in combination with smart devices.

The invention may exhibit a number of other advantages as well. For example, wind produced by the fan is typically effective to cool excessive temperatures, and may be directly and personally used by individual away from their usual premises and without any power mains supply available (for example train compartment etc.). That is, individuals may wish to protect themselves from or to alleviate excessive temperatures or their unpleasant attendant manifestations (including perspiration) through the use of the invention. Prior art fans are fundamentally unsuitable for this because they are generally too large and bulky and/or because they do not have an independent power supply. That is, they are tied to buildings.

In contrast, the invention provides a light, handy design and is equipped with built-in and independent power supply facilities. These independent electrical energy sources in particular may comprise an accumulator, with a charging device and a mains connection, a storage battery, also with a charging device and a mains connection, a dry battery and last but not least solar power on the basis of the photovoltaic effect.

The invention may also help prevent smart devices from overheating, or catching on fire. Some prior art devices are fundamentally unsuitable for external use outside of a motor vehicles air conditioning vent.

Variations of the invention are possible. For example, multiple solar panels can be used for two or more fan motors, in series, parallel or in the combination of these. Such panels may be formed from a plurality of photovoltaic cells immobilized relative to the smart device. The cells form a solar panel that converts sunlight and other photonic radiant energy electric power. Similarly, in some embodiments, at least one blowing fan and at least one exhaust fan and electrically connected to the output terminals of the electric connector.

It is to be understood that, while the invention has been described in conjunction with the preferred specific embodiments thereof, the foregoing description merely illustrates and does not limit the scope of the invention. Numerous alternatives and equivalents exist which do not depart from the invention set forth above. For example, any particular embodiment of the invention, e.g., those depicted in any drawing herein, may be modified to include or exclude features of other embodiments. Other aspects, advantages, and modifications within the scope of the invention will be apparent to those skilled in the art to which the invention pertains.

I claim:

1. A solar powered cooler for a smart device, comprising:
an upper fan casing;
a bottom fan casing;
a smart device holder for holding the smart device;
one or more cooling fans effective to draw air into an air passage formed between the upper fan casing and the smart device holder, thereby forcing the air to flow along a substantially vertical direction toward a bottom surface of the smart device in a substantially horizontal orientation;
one or more solar panels for harvesting solar energy and delivering electric power to the one or more cooling fans, the one or more solar panels connected to the one or more fans via one or more connector cables; and
one or more solar panel protector covers having a clear plastic window over the one or more solar panels, the one or more solar panel protector covers secured to the one or more solar panels with snap fastener and insert elements.

2. The cooler of claim 1, wherein the one or more cooling fans are located between the upper fan casing and the bottom fan casing.

3. The cooler of claim 1, wherein at least one fan rotates about a substantially vertical axis.

4. The cooler of claim 1, having one or more vent holes formed in the upper and/or lower fan casing.

5. The cooler of claim 4, wherein the smart device holder contains the smart device in a manner such that the air directed towards the bottom surface of the smart device flows horizontally over the bottom surface.

6. The cooler of claim 5, wherein the smart device is attached to the upper fan casing by magnetic means.

7. The cooler of claim 6, wherein the smart device is a smartphone or smart tablet.

8. A solar powered cooler for a smart device, comprising:
an upper fan casing including one or more vent holes;
a bottom fan casing including one or more air inlet holes located at or near an edge of the bottom fan casing, the upper and bottom fan casing defining an air passage to allow air flow from the one or more air inlet holes to the one or more vent holes;
a smart device holder for holding the smart device;
one or more cooling fans effective to draw the air into the air passage so as to force the air to flow along a substantially vertical direction through the one or more vent holes toward a bottom surface of the smart device;
one or more solar panels for harvesting solar energy and delivering electric power to the one or more cooling fans, the one or more solar panels connected to the one or more fans via one or more connector cables; and
one or more solar panel protector covers having a clear plastic window over the one or more solar panels, the one or more solar panel protector covers secured to the one or more solar panel with snap fastener and insert elements.

9. A solar powered cooler for a smart device, comprising:
an upper fan casing including one or more vent holes;
a bottom fan casing including one or more air inlet holes located at or near an edge of the bottom fan casing, the upper and bottom fan casing defining an air passage to allow air flow from the one or more air inlet holes to the one or more vent holes;
a smart device holder for holding the smart device;
one or more cooling fans located between the upper and lower fan casings, the one or more cooling fans covering the one or more air inlet holes effective to draw the air into the air passage so as to force the air to flow along a substantially vertical direction toward a bottom surface of the smart device;

one or more solar panels for harvesting solar energy and delivering electric power to the one or more cooling fans, the one or more solar panels connected to the one or more fans via one or more connector cables; and one or more solar panel protector covers having a clear plastic window over the one or more solar panels, the one or more solar panel protector covers secured to the one or more solar panel with snap fastener and insert elements.

\* \* \* \* \*